(12) United States Patent
Hilker et al.

(10) Patent No.: US 12,180,410 B2
(45) Date of Patent: Dec. 31, 2024

(54) THERMAL MANAGEMENT SYSTEM

(71) Applicant: SHELL USA, INC., Houston, TX (US)

(72) Inventors: Andree Hilker, Hamburg (DE); Volker Klaus Null, Hamburg (DE)

(73) Assignee: Shell USA, INC., Houston, TX (US)

( * ) Notice: Subject to any disclaimer, the term of this patent is extended or adjusted under 35 U.S.C. 154(b) by 207 days.

(21) Appl. No.: 17/908,559

(22) PCT Filed: Mar. 24, 2021

(86) PCT No.: PCT/EP2021/057611
§ 371 (c)(1),
(2) Date: Sep. 1, 2022

(87) PCT Pub. No.: WO2021/197968
PCT Pub. Date: Oct. 7, 2021

(65) Prior Publication Data
US 2023/0097290 A1    Mar. 30, 2023

(30) Foreign Application Priority Data
Mar. 30, 2020  (EP) ..................................... 20166789

(51) Int. Cl.
*F23L 15/02* (2006.01)
*C09K 5/10* (2006.01)
(Continued)

(52) U.S. Cl.
CPC ................ C09K 5/10 (2013.01); C09K 15/08 (2013.01); C10M 115/02 (2013.01);
(Continued)

(58) Field of Classification Search
CPC ....... C09K 5/10; C09K 15/05; H01M 10/615; H01M 10/625; H01M 10/667;
(Continued)

(56) References Cited

U.S. PATENT DOCUMENTS 4,824,601 A    4/1989 Franklin
6,008,164 A   12/1999 Aldrich et al.
(Continued)

FOREIGN PATENT DOCUMENTS

CA    3075181 A1 *  3/2019
CN    105703498 A    6/2016
(Continued)

OTHER PUBLICATIONS

International Search Report and Written Opinion received for PCT Patent Application No. PCT/EP2021/057611, mailed on Jun. 6, 2021, 10 pages.
(Continued)

*Primary Examiner* — Davis D Hwu
(74) *Attorney, Agent, or Firm* — Shell USA, Inc.

(57) ABSTRACT

The present invention provides a thermal management system comprising a housing having an interior space; a heat-generating component disposed within the interior space; a heat exchanger; and a working fluid liquid disposed within the interior space wherein the heat-generating component is in contact with the working fluid. The working fluid comprises a Fischer-Tropsch derived base fluid; an antioxidant and anti-static additives. The system is constructed wherein a constant cyclical flow of working fluid is maintained across the heat-generating components, on to the heat exchanger and then back to the heat-generating component. The present invention provides a method of thermal management of a heat-generating component comprising partially immersing a heat-generating component in a working fluid and transferring the heat from the heat-generating component using the working fluid in a constant cyclical flow of working fluid across the heat-generating components, on to a heat exchanger and then back to the heat-generating component.

11 Claims, 2 Drawing Sheets

(51) Int. Cl.
| | |
|---|---|
| *C09K 15/08* | (2006.01) |
| *C10M 115/02* | (2006.01) |
| *C10M 129/10* | (2006.01) |
| *C10M 135/10* | (2006.01) |
| *C10M 141/08* | (2006.01) |
| *C10M 169/04* | (2006.01) |
| *H01M 10/615* | (2014.01) |
| *H01M 10/625* | (2014.01) |
| *H01M 10/667* | (2014.01) |
| *H05K 7/20* | (2006.01) |
| *C10N 30/00* | (2006.01) |
| *C10N 30/10* | (2006.01) |
| *C10N 40/16* | (2006.01) |

(52) U.S. Cl.
CPC ........ *C10M 129/10* (2013.01); *C10M 135/10* (2013.01); *C10M 141/08* (2013.01); *C10M 169/04* (2013.01); *H01M 10/615* (2015.04); *H01M 10/625* (2015.04); *H01M 10/667* (2015.04); *H05K 7/20872* (2013.01); *C10M 2203/003* (2013.01); *C10M 2207/023* (2013.01); *C10M 2219/044* (2013.01); *C10N 2030/10* (2013.01); *C10N 2030/28* (2020.05); *C10N 2040/16* (2013.01); *H01M 2220/20* (2013.01)

(58) Field of Classification Search
CPC .. C10M 115/02; C10M 29/10; C10M 135/10; C10M 141/08; C10M 169/04
USPC .......................................................... 165/7
See application file for complete search history.

(56) References Cited

U.S. PATENT DOCUMENTS

| | | | |
|---|---|---|---|
| 6,059,955 | A | 5/2000 | Cody et al. |
| 6,090,989 | A | 7/2000 | Trewella et al. |
| 6,103,099 | A | 8/2000 | Wittenbrink et al. |
| 6,332,974 | B1 | 12/2001 | Wittenbrink et al. |
| 6,410,490 | B1 | 6/2002 | Reyes-gavilan et al. |
| 6,420,618 | B1 | 7/2002 | Berlowitz et al. |
| 6,475,960 | B1 | 11/2002 | Berlowitz et al. |
| 6,506,297 | B1 | 1/2003 | Wittenbrink et al. |
| 6,599,864 | B1 | 7/2003 | Bertomeu |
| 6,610,636 | B2 | 8/2003 | Berlowitz et al. |
| 7,067,049 | B1 | 6/2006 | Baillargeon et al. |
| 7,473,347 | B2 | 1/2009 | Germaine |
| 9,206,379 | B2 | 12/2015 | Smith |
| 2009/0001330 | A1* | 1/2009 | Arickx ................ H01B 3/22 252/570 |
| 2009/0023056 | A1 | 1/2009 | Adams et al. |
| 2009/0042753 | A1 | 2/2009 | Poirier et al. |
| 2009/0068552 | A1 | 3/2009 | Murata |
| 2009/0082235 | A1 | 3/2009 | Hilker et al. |
| 2010/0025006 | A1 | 2/2010 | Zhou |
| 2011/0021356 | A1 | 1/2011 | Sievernich et al. |
| 2017/0005381 | A1 | 1/2017 | Harris |
| 2017/0279172 | A1 | 9/2017 | Tucker |
| 2020/0178414 | A1 | 6/2020 | Bulinski et al. |

FOREIGN PATENT DOCUMENTS

| | | |
|---|---|---|
| CN | 109841918 A | 6/2019 |
| EP | 0668342 A1 | 8/1995 |
| EP | 0776959 A2 | 6/1997 |
| IN | 201841043026 A | 11/2018 |
| JP | H11185530 A * | 7/1999 |
| JP | 2009126256 A | 6/2009 |
| JP | 2011201953 A | 10/2011 |
| JP | 2013043933 A | 3/2013 |
| WO | 2017089313 A1 | 6/2017 |
| WO | 2017202717 A1 | 11/2017 |
| WO | 2019091856 A1 | 5/2019 |

OTHER PUBLICATIONS

International Search Report and Written Opinion received for PCT Patent Application No. PCT/EP2021/057625, mailed on Jun. 7, 2021, 8 pages.

Hu et al., "Battery Warm-up Methodologies at Subzero Temperatures for Automotive Applications: Recent Advances and Perspectives", Progress in Energy and Combustion Science, 2020, vol. 77, pp. 1-28.

Moghaddam, "Designing Battery Thermal Management Systems(Btms) for Cylindrical Lithium-ion Battery Modules Using Cfd", Kth School of Industrial Engineering and Management, Feb. 4, 2019, 60 Pages.

Hunt et al., "Surface Cooling Causes Accelerated Degradation Compared to Tab Cooling for Lithium-ion Pouch Cells", Journal of the Electrochemical Society, 2016, vol. 163, Issue No. 9, pp. A1846-A1852.

Patil et al., "A Novel Design for Lithium Ion Battery Cooling Using Mineral Oil", Advanced Science and Technology Letters, 2016, vol. 141, pp. 164-168.

"Heat transfer applications using 3M™ Novec™ Engineered Fluids", 3M, 2007, 2 Pages.

Sundin et al., "Mineral Oil, White Oil and Synthetic Dielectric Coolants How Engineered Fluids' Dielectric Coolants Differ From Petroleum Based Dielectric Oils", Engineered Fluids, Apr. 26, 2018, 15 Pages.

Khan et al., "Towards an Ultimate Battery Thermal Management System: a Review", Batteries, 2017, vol. 3, Issue No. 9, 18 Pages.

Hainzlmaier, "10 KW, 800 Volts—new trends in future electric heating for passenger and commercial electric vehicles", Thermal Management for EV/HEV, Feb. 14, 2017, 26 Pages.

Ruiz et al., "JRC Exploratory Research: Safer Li-ion Batteries by Preventing Thermal Propagation", Jrc Technical Reports, Mar. 8-9, 2018, 53 Pages.

Chen et al., "Comparison of Different Cooling Methods for Lithium Ion Battery Cells", Applied Thermal Engineering, 2016, vol. 94, pp. 846-854.

Kastler, "Effective Battery Design and Integration of Cylindrical Cells for High Power Applications", 18th CTI Symposium, Dec. 9-12, 2019, 18 Pages.

3m™ Novec™ 7000 Engineered Fluid, Technical Data, Sep. 2021, 6 Pages.

Hermann et al., "Next Generation Module for Ultra Fast Charging", VDI Wissensforum, 23 Pages.

"Antistatic agent", https://en.wikipedia.org/wiki/Antistatic_agent, Nov. 10, 2021, 2 Pages.

"Immersion Cooling for Electric Vehicle Batteries in 3M Novec Engineered Fluid", https://www.youtube.com/watch?v=hjEpQeWwjIU, Mar. 6, 2018.

"Thermal Management", https://www.3m.com/3M/en_US/novec-us/applications/thermal-management, accessed on Oct. 14, 2022, 9 Pages.

"3M Thermal Runaway Barrier Materials", https://www.3m.com/3M/en_US/oem-tier-us/applications/propulsion/ev-battery/thermal-runaway-barrier, accessed on Oct. 14, 2022, 5 Pages.

* cited by examiner

THERMAL MANAGEMENT SYSTEM

CROSS REFERENCE TO RELATED APPLICATIONS

This is a National stage application of International application No PCT/EP2021/057611, filed 24 Mar. 2021, which claims priority of EP application No. 20166789.6, filed 30 Mar. 2020 which is incorporated herein by reference in its entirety.

FIELD OF THE INVENTION

This invention relates to a thermal management system, a method of thermal management for a heat-generating component and the use of a Fischer-Tropsch derived base fluid in a working fluid in contact with a heat-generating component in a thermal management system.

BACKGROUND OF THE INVENTION

Throughout a range of industries, new technologies are being sought in order to provide more energy efficient, lower $CO_2$ solutions. This invention relates to a number of possible efficiencies driving lower energy requirements and lower $CO_2$ emissions. Firstly, it relates to electric vehicle technology. Secondly, the invention is also applicable to the thermal management of IT equipment, such as servers. However, the invention described herein is not inherently limited by the technology to which it may be applied. The present invention is applicable to any heat-generating electric technology.

By 2040, it is expected that up to 50% of all new passenger car sales will be electric vehicles. This includes battery electric vehicles (BEV) and hybrid electric vehicles (HEV) of fuel cell electric vehicles (FCEV). Hybrid electric vehicles include a battery in combination with conventional combustion engines or fuel cells. Fuel cell electric vehicles also need a battery for buffering and interim storage of electrical energy.

Current battery technology relies on lithium-ion batteries and it is likely that these will remain the dominant battery technology for at least the next 15 years. While slow charging at home or destination is likely to be the dominant way of charging, high-performance fast-charging (HPC) during a journey will be required by many customers who want to drive longer distances. To improve and shorten the charging process, it is required to increase voltage, current, or both at the same time. A higher current will also increase excess heat generated. The level of excess heat is very high and can reach 20 kWh or higher. Effective thermal management to control temperature uniformity within the cell pack is required to prevent battery cells from irreversible deterioration.

Within an electric vehicle, other components also require thermal management, especially cooling. Heat is generated by both the electric motor and the inverter in use. A method of thermal management that could be applied to each of these components and preferably a circuit incorporating all of these components (including the battery) would be most desirable.

Fuel cell powered electrical systems also generate significant waste heat (approximately 50% of the energy is produced as waste heat) in use that needs to be removed during operation.

The thermal management of components provides challenges across other industries as well. The thermal management of IT components, especially servers, also provides many challenges. Air cooling of these components requires high energy usage and expensive cooling infrastructure. A simpler, more energy efficient system for the thermal management of these electronic components would be highly desirable.

Most cooling systems historically have used air passed over the source of heat in order to manage excess heat. However, such systems are limited in heat capacity and are not capable of managing the heat produced, for example, in an electrical device subjected to the strains of a process such as HPC. The infrastructure included in an air-cooling system can also be complex, expensive and involve the maintenance of many moving parts.

More advanced thermal management systems have been developed in which a conventional water/glycol mixture is used as a heat transfer fluid. A battery block, containing a large number of individual battery cells, may be effectively cooled with a water/glycol mixture. This is rapidly becoming the dominant thermal management technology in use in electric vehicles sold today as it is more efficient than air-cooling. US20090023056, US20100025006 and US2011021356, in the name of Tesla Motors Inc., describe pipe systems in which about 11% percent of the cell surface are directly in contact with pipes containing coolants. In these indirect thermal management systems, the heat needs to pass through the pipe material and then the heat is transferred to the glycol/water. This limits the overall effectiveness of this heat transfer design.

Phase change materials (PCMs) are also utilized in some systems and are an effective means to take up heat while they change from solid to liquid state. PCMs are limited to the melting temperature of the selected and is not suitable for thermal management. At high ambient temperatures, the PCM could melt without any extra heat dissipated from the heat-generating component.

Under HPC conditions, if these systems fail to control cell temperature and uniformity effectively, the battery management system (BMS) in the car limits the current to protect the battery. This can slow down the charging process very significantly and limits fast charging capability. Other systems may simply over-heat or be subject to safety shutdowns in high temperature conditions.

Direct liquid cooling, involving novel thermal management systems, generally designed with heat-generating components immersed in a liquid coolant, can help control each component's temperature much more effectively, as the fluid is directly in contact with the cell surface. Such a system is described, for example, in US20170279172. To prevent short circuits, this requires a fluid with very good dielectric properties. Suitable fluids also require low viscosity, to aid pumping, as well as high thermal conductivity and heat capacity. It has already been demonstrated that immersive thermal management can help to increase power and energy density ratios and also significantly enhance cell durability.

Hydrofluorinated ethers have been demonstrated as suitable fluids for immersive thermal management (e.g. in WO2018224908). While this fluid reduces the flammability risk, it places several technical challenges for the application such as resulting high pressures due to its low boiling temperature, high density and challenges in material compatibility.

Developing improved methods and suitable working fluids for directly thermally managing electrical systems remains an on-going challenge. Such working fluids require excellent material compatibility, thermodynamic properties and low flammability. Cost and weight considerations need also to be taken into account for practical purposes. The dielectric properties of these working fluids must be maintained over time. It is important that the fluids have low conductivity levels, which can be maintained as the fluid ages, so as to prevent short circuits and/or damage to the heat-generating component. The avoidance of electrostatic charging of the working fluid during use, e.g. when pumping at high flow rates, is also desirable.

SUMMARY OF THE INVENTION

Figure 1:
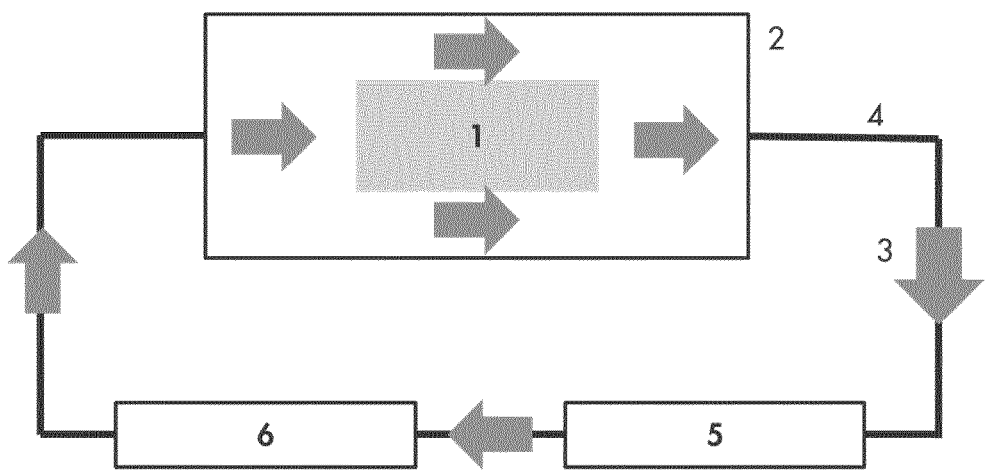
FIG. 1 illustrates a simplified circuit for a thermal management system of the present invention.

The present invention provides a thermal management system comprising:
a housing having an interior space;
a heat-generating component disposed within the interior space;
a heat exchanger; and
a working fluid liquid disposed within the interior space such that the heat-generating component is in contact with the working fluid;
wherein the working fluid comprises a Fischer-Tropsch derived base fluid; an antioxidant additive and an anti-static additive, wherein the thermal management system is constructed such that a constant cyclical flow of working fluid is maintained across the one or more heat-generating components, on to the heat exchanger and then back to the heat-generating component.

The present invention also provides a method of thermal management of a heat-generating component comprising the steps of at least partially immersing a heat-generating component in a working fluid; and transferring the heat from the heat-generating component using the working fluid in a constant cyclical flow of working fluid across the one or more heat-generating components, on to a heat exchanger and then back to the heat-generating component, wherein the working fluid comprises a Fischer-Tropsch derived base fluid; an antioxidant additive; and an antistatic additive.

The present invention also provides for the use of a Fischer-Tropsch derived base fluid in a working fluid in contact with a heat-generating component in a thermal management system to improve anti-aging properties of the working fluid, wherein the working fluid also comprises an antioxidant additive and an anti-static additive.

DETAILED DESCRIPTION OF THE INVENTION

The present inventors have surprisingly found that a highly efficient system and method for immersion thermal management of a heat-generating component may be provided wherein a heat-generating component is in direct contact with a working fluid and wherein said working fluid comprises a Fischer-Tropsch derived base fluid; an antioxidant additive; and an antistatic additive.

The heat-generating component is preferably an electrical element. Typical electrical elements that may benefit from the system and method described herein include computer servers, batteries, inverters, electric motors and fuel cells, or any combination of these.

One or more heat-generating components may be cooled within the thermal management system of the invention.

The thermal management system of the invention comprises a housing having an interior space; a heat-generating component disposed within the interior space; and a working fluid liquid disposed within the interior space such that the heat-generating component is in direct contact with the working fluid. The heat-generating component may be partially immersed, and up to fully immersed, in the working fluid.

The thermal management system is constructed such that a constant cyclical flow of working fluid is maintained across the one or more heat-generating components, on to a heat exchanger and then back to the heat-generating component.

The heat exchanger may be disposed within or external to the housing.

The thermal management system may comprise a liquid circuit with a pump and a heat exchanger. In this embodiment, the pump operates to move the working fluid from the heat-generating component to and from the heat exchanger.

Heat is transferred from the heat-generating component to the working fluid. The working fluid may then be pumped away from the heat-generating component to a heat exchanger. Heat may then be transferred from the working component via the heat exchanger. The working fluid may then be returned to the heat-generating component.

As well as functioning to remove heat from the heat-generating component disposed therein, the thermal management system may also be suitable to provide heat to the heat-generating component at certain times during the functioning of said component, e.g. at start-up or during running in cold environments. In this embodiment of the invention a source of heating will be included in the thermal management system. Such a source of heat may comprise an internal heat source or an external heat source. A control mechanism will also be included in the thermal management system to allow switching between cooling and heating embodiments of the system.

A suitable internal heat source may involve a battery with a load to form a heat-generating circuit. Suitable external heat sources include heat pumps, phase change materials capable of releasing heat upon the phase change, electric heaters and heaters burning ethanol, bioethanol or other fuels.

The working fluid comprises a Fischer-Tropsch derived base fluid and an antioxidant additive. Preferably, the working fluid also comprises an antistatic additive.

Fischer-Tropsch derived base fluids are known in the art. By the term "Fischer-Tropsch derived" is meant that a base fluid is, or is derived from, a synthesis product of a Fischer-Tropsch process.

Fischer-Tropsch derived base fluids are often classified by the starting material in the Fischer-Tropsch process, i.e. 'X-to-liquids' or 'XTL', with X standing for said starting material. Biomass-to-liquid (BTL), coal to liquids (CTL), gas-to-liquid (GTL) and power-to-liquid (PTL) processes are some examples of Fischer-Tropsch processes producing base fluids. Preferably, the Fischer-Tropsch derived base fluid is a GTL (Gas-To-Liquids) base fluid.

Suitable Fischer-Tropsch derived base fluids including oils that may be conveniently used in the Fischer-Tropsch derived working fluid are those as for example disclosed in EP0776959, EP0668342, WO97021788, WO0015736, WO0014188, WO0014187, WO0014183, WO0014179, WO0008115, WO9941332, EP1029029, WO0118156 and WO 0157166.

The Fischer-Tropsch derived base fluids for use in the invention preferably have kinematic viscosities at 100° C. of at most 4 mm$^2$/s.

A particularly preferred Fischer-Tropsch derived base fluid for use in the working fluid herein is a Fischer-Tropsch derived base oil with a kinematic viscosity at 100° C. in the range of from 2 to 4 mm$^2$/s, for example GTL 3 (having a kinematic viscosity at 100° C. of approximately 3 mm$^2$/s).

Another particularly preferred Fischer-Tropsch derived base fluid for use in the working fluid herein is a Fischer-Tropsch derived base fluid produced from a gas oil stream, preferably a dewaxed gas oil stream, from a GTL process, wherein said fluid has a kinematic viscosity at 40° C. in the range of from 2.0 to 11 mm$^2$/second. Preferably said Fischer-Tropsch derived base fluid produced from a gas oil stream has a kinematic viscosity at 40° C. of at least 2.1 mm$^2$/second, more preferably at least 2.2 mm$^2$/second. Also preferably, said fluid has a kinematic viscosity at 40° C. of at most 10.0 mm$^2$/second, more preferably at most 7.0 mm$^2$/second, most preferably at most 6.0 mm$^2$/second.

In one embodiment of the invention the working fluid comprises a mixture of more than one Fischer-Tropsch derived base fluid. For example, the working fluid may comprise both a Fischer-Tropsch derived base oil with a kinematic viscosity at 100° C. in the range of from 2 to 4 mm$^2$/s and a Fischer-Tropsch derived base fluid produced from a gas oil stream.

The total amount of Fischer-Tropsch derived base fluids incorporated in the working fluid is preferably in the range of from 60.0 to 99.9 wt. %.

Other components within the working fluid may include one or more additional base oils including mineral oils and synthetic oils. Mineral oils include liquid petroleum oils and solvent-treated or acid-treated mineral lubricating oil of the paraffinic, naphthenic, or mixed paraffinic/naphthenic type which may be further refined by hydrofinishing processes and/or dewaxing. Synthetic oils include hydrocarbon oils such as olefin oligomers (including polyalphaolefin base oils; PAOs), dibasic acid esters, polyol esters, polyalkylene glycols (PAGs), alkyl benzenes, alkyl naphthalenes and dewaxed waxy isomerates.

In one preferred embodiment, the working fluid comprises one or more additional base oils selected from alkyl benzenes, alkyl naphthalenes and mixtures thereof. If present, the one or more additional base oils selected from alkyl benzenes, alkyl naphthalenes and mixtures thereof are present in no more than 35 wt % with respect to the total weight of the working fluid. Preferably the one or more additional base oils selected from alkyl benzenes, alkyl naphthalenes and mixtures thereof are present in an amount in the range of from 1 to 30 wt % with respect to the total weight of the working fluid.

The working fluid preferably has a pour point of less than or equal to −40° C., more preferably less than or equal to −50° C., measured according to ISO 3016.

The working fluid also preferably has a flash point of at least 100° C., more preferably at least 110° C., most preferably at least 120° C., and preferably at most 240° C., according to ASTM D93.

The working fluid preferably has a kinematic viscosity at 40° C. of at least 2.0 mm$^2$/s, more preferably at least 2.1 mm$^2$/s, most preferably at least 2.2 mm$^2$/s, measured according to ISO 3104. The working fluid preferably has a kinematic viscosity at 40° C. of at most 22.0 mm$^2$/s, more preferably at most 11.0 mm$^2$/s, most preferably at most 10.0 mm$^2$/s.

The thermal conductivity of the working fluid at 20° C. is preferably at least 0.135 w/mK, measured according to ASTM D7896.

The specific heat capacity of the working fluid at 20° C., according to ASTM D 1269, is preferably at least 1.9 kJ/kg*K, more preferably at least 2.0 kJ/kg*K.

The antioxidant additive is suitably a hindered phenolic antioxidant additive, sterically hindered monohydric, dihydric and trihydric phenols, sterically hindered dinuclear, trinuclear and polynuclear phenols.

Sterically hindered phenolic antioxidants of particular interest may be selected from the group consisting of 2,6-di-tert-butylphenol (available under the trade designation "IRGANOX™ L 140" from BASF), di tert-butylated hydroxytoluene ("BHT"), methylene-4,4'-bis-(2.6-tert-butylphenol), 2,2'-methylene bis-(4,6-di-tert-butylphenol), 1,6-hexamethylene-bis-(3,5-di-tert-butyl-hydroxyhydrocinnamate) (available under the trade designation "IRGANOX™ L109" from BASF), ((3,5-bis(1,1-dimethylethyl)-4-hydroxyphenyl)methyl)thio) acetic acid, $C_{10}$-$C_{14}$isoalkyl esters (available under the trade designation "IRGANOX™ L118" from BASF), 3,5-di-tert-butyl-4-hydroxyhydrocinnamic acid, $C_7$-$C_9$alkyl esters (available under the trade designation "IRGANOX™ L135" from BASF,) tetrakis-(3-(3,5-di-tert-butyl-4-hydroxyphenyl)-propionyloxymethyl)methane (available under the trade designation "IRGANOX™ 1010" from BASF), thiodiethylene bis(3,5-di-tert-butyl-4-hydroxyhydrocinnamate (available under the trade designation "IRGANOX™ 1035" from BASF), octadecyl 3,5-di-tert-butyl-4-hydroxyhydrocinnamate (available under the trade designation "IRGANOX™ 1076" from BASF), 2,5-di-tert-butylhydroquinone and mixtures thereof.

Particularly preferred antioxidants for use herein are di-tert-butylated hydroxytoluene ("BHT") and $C_7$ to $C_9$ alkyl esters of 3,5-di-tert-butyl-4-hydroxyhydrocinnamic acid, (available under the trade designation "IRGANOX™ L135" from BASF).

In one embodiment of the invention, more than one antioxidant additive may be present in the working fluid.

Optionally, an additional amine antioxidant, for example an alkylated or styrenated diphenylamine, may be added to the working fluid.

Examples of amine antioxidants are aromatic amine antioxidants for example N,N'-Di-isopropyl-p-phenylenediamine, N,N'-di-sec-butyl-p-phenylenediamine, N,N'-bis(1,4-dimethyl-pentyl)-p-phenylenediamine, N,N'-bis(1-ethyl-3-methyl-pentyl)-p-phenylene-diamine, N,N'-bis(1-methylheptyl)-p-phenylenediamine, N,N'-dicyclohexyl-p-phenylene-diamine, N,N'-diphenyl-p-phenylenediamine, N,N'-di(naphthyl-2-)-p-phenylenediamine, N-isopropyl-N'-phenyl-p-phenylenediamine, N-(1,3-dimethylbutyl)-N'-phenyl-p-phenylenediamine, N-(1-methylheptyl)-N'-phenyl-p-phenylenediamine, N'-cyclohexyl-N'-phenyl-p-phenylenediamine, 4-(p-toluene-sulfoamido)diphenylamine, N,N'-dimethyl-N,N'-di-sec-butyl-p-phenylenediamine, diphenylamine, N-allyldiphenylamine, 4-isopropoxydiphenylamine, N-phenyl-1-naphthylamine, N-phenyl-2-naphthylamine, octylated diphenylamine, e.g. p,p'-di-tert-octyldiphenylamine, 4-n-butylaminophenol, 4-butyrylaminophenol, 4-nonanoylaminophenol, 4-dodecanoylaminophenol, 4-octadecanoylaminophenol, di(4-methoxyphenyl)amine, 2,6-di-tert-butyl-4-dimethylamino-methylphenol, 2,4'-diaminodiphenylmethane, 4,4'-diaminodiphenylmethane, N,N,N',N'-tetramethyl-4,4'-diaminodiphenylmethane, 1,2-di(phenylamino)ethane, 1,2-di[(2-methylphenyl)amino]ethane, 1,3-di(phenylamino)-propane, (o-tolyl)biguanide, di[4-

(1',3'-dimethyl-butyl)phenyl]amine, alkylated phenyl alpha naphthylamines, e.g. tert-octylated N-phenyl-1-naphthylamine, mixture of mono- and dialkylated tert-butyl-/tert-octyl-diphenylamines, 2,3-dihydro-3,3-dimethyl-4H-1,4-benzothiazine, phenothiazine, N-allylphenothiazine, tert-octylated phenothiazine, 3,7-di-tert-octylphenothiazine, Also possible amine antioxidants are those according to formula VIII and IX of EP1054052, which compounds are also described in U.S. Pat. No. 4,824,601.

The total amount of the one or more antioxidant additives present in the working fluid is preferably at least 0.1 wt %, more preferably at least 0.15 wt % and preferably at most 3.0 wt %, more preferably at most 2.0 wt % with respect to the total weight of the working fluid.

The antistatic additive for use herein is preferably selected from those containing alkyl substituted naphthalene sulfonic acids, benzotriazole and substituted benzotriazoles.

Substituted benzotriazole compounds for use herein may be represented by the formula (I).

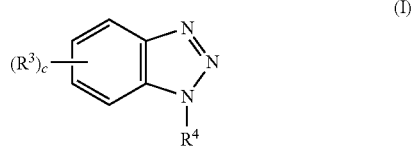

wherein $R^4$ may be hydrogen or a group represented by the formula (II)

or by the formula (III)

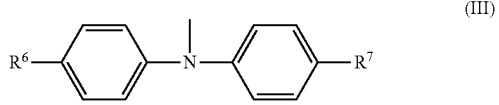

wherein:
c is 0, 1, 2 or 3;
$R^1$ and $R^2$ are hydrogen or the same or different straight or branched alkyl groups of 1-18 carbon atoms, preferably a branched alkyl group of 1-12 carbon atoms; $R^3$ is a straight or branched $C_{1-4}$ alkyl group, preferably $R^3$ is methyl or ethyl and C is 1 or 2; $R^5$ is a methylene or ethylene group; $R^6$ and $R^7$ are the same or different alkyl groups of 3-15 carbon atoms, preferably of 4-9 carbon atoms.

Preferred compounds are 1-[bis(2-ethylhexyl)-aminomethyl]benzotriazole, methylbenzotriazole, dimethylbenzotriazole, ethylbenzotriazole, ethylmethylbenzotriazole, diethylbenzotriazole and mixtures thereof. Other preferred compounds include (N-Bis(2-ethylhexyl)-aminomethyl-tolutriazole, non-substituted benzotriazole, and 5-methyl-1H-benzotriazole.

Preferred alkyl substituted naphthalene sulfonic acids include di C8-C10, branched, C9 rich, alkylnaphthalene sulphonic acid, such as those commercially available as "Stadis 450" from Innospec.

The content of the above antistatic additive in the working fluid herein is preferably above 0.5 mg/kg and more preferably above 1 mg/kg with respect to the total weight of the working fluid. A practical upper limit may vary depending on the specific application of the lubricating composition. This concentration may be up to 3 wt. %, preferably however in the range of from 1 mg/kg to 1 wt. % with respect to the total weight of the working fluid. However, such compounds may be advantageously used at concentrations below 1000 mg/kg and more preferably below 300 mg/kg with respect to the total weight of the working fluid.

It has also been surprisingly found that the use of a Fischer-Tropsch derived base fluid in a working fluid also comprising such antioxidant and antistatic additives in contact with a heat-generating component in a thermal management system provides said working fluid with improved anti-aging properties. By 'anti-aging properties' herein, is meant at least one property selected from electrical conductivity at 24 and/or 90° C. (measured according to IEC 60247), appearance and sludge formation (measured according to visual rating), relative permittivity (measured according to IEC 60247) and discoloration (measured according to ISO 2049) is maintained at a suitable level over time. Preferably, the use of a Fischer-Tropsch derived base fluid in a working fluid also comprising antioxidant and antistatic additives in contact with a heat-generating component in a thermal management system provides said working fluid with improved conductivity levels over time.

DETAILED DESCRIPTION OF THE DRAWINGS

FIG. 1 shows a suitable liquid circuit for the thermal management system of the present invention. In FIG. 1, a heat-generating component (1) is disposed within a housing (2). Working fluid flows (3) through the interior space of the housing (1) and then through connecting pipework (4) to one or more heat exchanger (5). In this embodiment, said flow is maintained by a pump (6).

Figure 2:
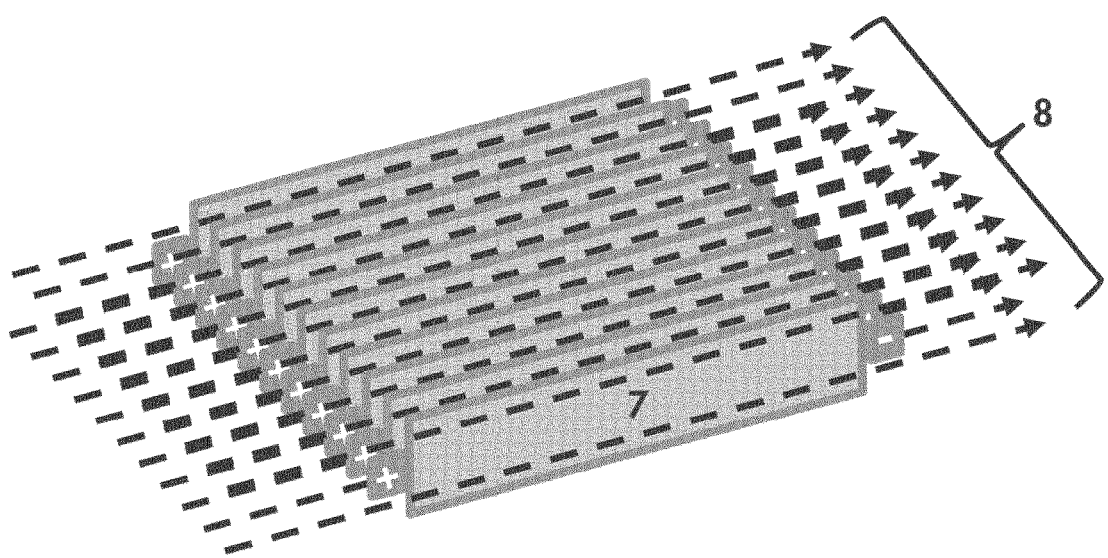
FIG. 2 is an illustration of a battery comprising a number of cells within a thermal management system according to the invention.

FIG. 2 is an illustration of a battery comprising a number of cells within a thermal management system according to the invention. In this embodiment, a number of pouch cells (7) are disposed within a housing (not shown). The flow of the working fluid across and between the pouch cells (7) is indicated by the arrows (8).

The present invention will now further be illustrated by the following, non-limiting, examples.

Examples

Six blends of working fluid formulations were produced according to the components listed in Table 2. The base oils used were an API Group I base oil commercially available as HVI60 from Shell and a Fischer-Tropsch derived base oil commercially available as GTL 3 from Shell. The base oil characteristics are indicated in Table 1.

TABLE 1

| | Test method | API Group I Base oil | GTL3 Base oil |
|---|---|---|---|
| Colour | ISO 2049 | 0.4 | <0.2 |
| Kinematic Viscosity @ 100° C. | ISO 3104 | 4.5 | 2.7 |
| Kinematic Viscosity @ 40° C. | ISO 3104 | 23.4 | 9.8 |
| Pour point | ISO 3016 | −15 | −42 |
| Flash point | ISO 2592 | 216 | 200 |

The antioxidant additive used in the Examples was di-tert-butylated hydroxytoluene (BHT) and the anti-static additive was Stadis 450, ex. Innospec. Stadis 450 is indicated to contain 10-25% di C8-C10, branched, C9 rich, alkylnaphthalene sulphonic acid.

maintains the electrical conductivity of said fluid over time at an excellent level that prevents static build up and short circuits. These improvements are not seen for the equivalent blends in working fluids comprising an API Group I base oil (blends 4 and 5).

TABLE 2

|  | Blend 1 | Blend 2 | Blend 3 | Blend 4 | Blend 5 | Blend 6 |
|---|---|---|---|---|---|---|
| Gp 1 Base oil | — | — | — | 99.7999 | 99.8 | 100 |
| GTL3 Base oil | 99.7999 | 99.8 | 100 | — | — | — |
| Antioxidant | 0.2 | 0.2 | — | 0.2 | 0.2 | — |
| Antistatic | 0.00045 | — | — | 0.00045 | — | — |
| Electrical Conductivity (pS/m) @ 90° C. | | | | | | |
| fresh oil | 35 | 0.04 | 0.04 | 140 | 14.4 | 8.7 |
| after 1 week | 0.7 | 0.8 | 0.9 | 1358 | 425 | 826 |
| after 2 weeks | 0.2 | 0.7 | 2.5 | 1358 | 1190 | 1752 |
| after 3 weeks | 33 | 0.4 | 0.5 | 3738 | 3502 | 3734 |
| after 4 weeks | 63 | 0.8 | 151 | 5345 | 4967 | 5531 |
| Appearance | | | | | | |
| fresh oil | clear, free of deposit | clear, free of deposit | clear, free of deposit | clear, free of deposit | clear, free of deposit | clear, free of deposit |
| after 1 week | clear, free of deposit | clear, free of deposit | clear, free of deposit | clear, free of deposit | clear, free of deposit | clear, free of deposit |
| after 2 weeks | clear, free of deposit | clear, free of deposit | clear, free of deposit | dark, deposit | dark, free of deposit | dark, free of deposit |
| after 3 weeks | clear, slight deposit | clear, slight deposit | clear, slight deposit | dark, deposit | dark, deposit | dark, deposit |
| after 4 weeks | hazy, some deposit | hazy, some deposit | hazy, some deposit | hazy, sludge | hazy, sludge | hazy, sludge |
| Colour | | | | | | |
| fresh oil | <0.2 | <0.2 | <0.2 | 0.4 | 0.4 | 0.4 |
| after 1 week | <0.2 | <0.2 | <0.2 | 6.7 | 6.2 | 5.8 |
| after 2 weeks | <0.2 | <0.2 | <0.2 | >8 | >8 | 8 |
| after 3 weeks | 0.2 | 0.4 | 0.6 | >8 | >8 | >8 |
| after 4 weeks | 1.2 | 1.3 | 1.8 | >8 | >8 | >8 |

The working fluids (900 mL per fluid) were each placed in 1000 mL beakers. A copper and steel coil was also placed in each beaker. Such coils were of the type used in the ASTM D493 test method for oxidation stability, but of half the usual size.

To prepare the copper and steel wire coils, 112 mm of low metalloid steel wire with a diameter of 1.59 mm and an electrolytic copper wire, length also 112 mm but with a diameter of 1.63 mm were placed beside each other. The wires were then twisted to a coil which was then used for the test.

The beakers containing the oil samples and coils were then kept in an oven (with air ventilation) at 120° C. The beakers were uncovered.

At each of the times indicated in Table 2 below, an oil sample of 125 mL was taken and tested. Electrical conductivity was tested according to IEC 60247. The appearance was tested by a visual assessment. The colour of the sample was tested according to ISO 2049

These Examples, representative of using the working fluids in a thermal management system, clearly demonstrate that working fluids comprising a Fischer-Tropsch derived base fluid (blends 1 to 3) have and maintain over time better conductivity and appearance characteristics, when compared with working fluids comprising an API Group I base oil (blends 4 to 6). These characteristics are further improved by the addition of an antioxidant additive (blend 2). Blend 2 demonstrates maintenance of electrical conductivity at low levels as well as maintenance of good appearance and colour characteristics. The further addition of an anti-static additive to a working fluid comprising a Fischer-Tropsch derived base fluid and an antioxidant additive

We claim:

1. A thermal management system comprising:
a housing having an interior space;
a heat-generating component disposed within the interior space;
a heat exchanger; and
a working fluid liquid disposed within the interior space such that the heat-generating component is in contact with the working fluid;
wherein the working fluid comprises a Fischer-Tropsch derived base fluid; an antioxidant additive and an anti-static additive selected from the group consisting of di C8-C10, branched, C9 rich, alkylnaphthalene sulphonic acid, alkylated benzotriazoles and benzotriazole, wherein the thermal management system is constructed such that a constant cyclical flow of working fluid is maintained across the one or more heat-generating components, on to the heat exchanger and then back to the heat-generating component.

2. The thermal management system of claim 1, wherein the antioxidant additive comprises a hindered phenol.

3. The thermal management system of claim 2, wherein the antioxidant additive is selected from the group consisting of 2,6-di-tert-butylphenol, di tert-butylated hydroxytoluene, methylene-4,4' bis-(2,6-tert-butylphenol), 2,2'-methylene bis-(4,6 di-tert-butylphenol), 1,6-hexamethylene-bis-(3,5 di tert-butyl-hydroxyhydrocinnamate), ((3,5-bis (1,1-dimethylethyl)-4-hydroxyphenyl) methyl) thio) acetic acid, C10-C14isoalkyl esters, 3,5 di tert-butyl-4-hydroxyhydrocinnamic acid, C7-C9alkyl esters, tetrakis-(3-(3,5-di-tert-butyl-4-hydroxyphenyl)-propionyloxymethyl) methane, thiodiethylene bis (3,5-di-tert-butyl-4-hydroxyhydrocinnamate, octadecyl 3,5 di-tert-butyl-4-hydroxyhydrocinnamate, 2,5-di-tert-butylhydroquinone and mixtures thereof.

4. The thermal management system of claim 1, wherein the thermal management system further comprises a pump, wherein the pump is configured to move the working fluid to and from the heat exchanger.

5. The thermal management system of claim 1, wherein the heat-generating component comprises a server.

6. The thermal management system of claim 1, wherein the heat-generating component is a battery.

7. The thermal management system of claim 1, wherein the heat-generating component is one or more of a battery, an e-motor and an inverter within an electric vehicle.

8. A method of thermal management of a heat-generating component comprising the steps of at least partially immersing a heat-generating component in a working fluid; and transferring the heat from the heat-generating component using the working fluid in a constant cyclical flow of working fluid across the one or more heat-generating components, on to a heat exchanger and then back to the heat-generating component, wherein the working fluid comprises a Fischer-Tropsch derived base fluid; an antioxidant additive; and an antistatic additive selected from the group consisting of di C8-C10, branched, C9 rich, alkylnaphthalene sulphonic acid, alkylated benzotriazoles and benzotriazole.

9. The method of claim 8, wherein said method comprises the steps of pumping the working fluid to a heat exchanger; transferring heat from the working fluid; and returning said working fluid to the heat-generating component.

10. The method of claim 8, wherein the antioxidant additive is a hindered phenol.

11. The method of claim 10, wherein the antioxidant additive is 2,6-di-tert-butyl-4-methylphenol.

\* \* \* \* \*